US006542630B1

United States Patent
Sherwood

(10) Patent No.: US 6,542,630 B1
(45) Date of Patent: Apr. 1, 2003

(54) INSPECTING COMPONENT PLACEMENT RELATIVE TO COMPONENT PADS

(75) Inventor: Lyle L. E. Sherwood, Pepperell, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/395,698

(22) Filed: Sep. 14, 1999

(51) Int. Cl.[7] .................................................. G06K 9/00
(52) U.S. Cl. ............................ 382/147; 348/87; 382/151
(58) Field of Search ............................. 382/146, 147, 382/151, 149, 145, 150, 203, 205; 348/126, 87; 250/559.34; 356/237.4, 237.5

(56) References Cited

U.S. PATENT DOCUMENTS

| 4,953,100 A | | 8/1990 | Yotsuga ........................ 364/559 |
| 5,134,575 A | * | 7/1992 | Takagi ........................... 382/147 |
| 5,627,912 A | * | 5/1997 | Matsumoto ................... 382/146 |
| 5,764,536 A | * | 6/1998 | Yamamoto et al. ........... 382/147 |

FOREIGN PATENT DOCUMENTS

| EP | 0685732 A | 12/1995 | ........... G01N/21/88 |
| EP | 0841558 A | 5/1998 | ........... G01N/21/88 |
| GB | 2331362 A | 5/1999 | ........... H05K/13/08 |

\* cited by examiner

Primary Examiner—Amelia M. Au
Assistant Examiner—Colin LaRose
(74) Attorney, Agent, or Firm—Bruce D. Rubenstein

(57) ABSTRACT

A method and apparatus for inspecting the placement of a device-under-inspection (DUI), for example a surface-mount component, on a circuit board includes scanning the circuit board to acquire stored images of the circuit board. From the stored images, a pad-bounding rectangle is constructed that circumscribes the outer edges of the pads for the DUI. An error-bounding rectangle is then constructed from the pad-bounding rectangle. The error-bounding rectangle has a length equal to the length of the pad-bounding rectangle plus a lengthwise error deemed allowable for placing the pins of the DUI over its pads. Similarly, the error-bounding rectangle has a width equal to the width of the pad-bounding rectangle plus an allowable widthwise error. A pin-bounding rectangle is constructed that circumscribes the outer edges of the pins of the DUI. The invention then determines whether the DUI is properly placed by examining whether any portion of the pin-bounding rectangle lies outside of the error-bounding rectangle. If so, the invention reports an unsuccessful placement of the DUI on the circuit board.

17 Claims, 3 Drawing Sheets

INSPECTING COMPONENT PLACEMENT RELATIVE TO COMPONENT PADS

This application relates generally to automatic optical inspection systems, and more particularly to verifying the placement of electrical components on printed circuit boards during the manufacturing processes of printed circuit board assemblies.

Electronics manufacturers use automatic optical inspection (AOI) to verify the manufacturing steps used to build circuit board assemblies. Many circuit board assemblies employ surface-mount technology (SMT) to achieve high component count and high pin count per component. Modern SMT components can have several hundred leads spaced apart by only 12 mil centers. Only ten years ago, leads of SMT components rarely were more closely spaced than 30 mil centers. As component lead spacing diminishes, the AOI systems that inspect component assemblies must become increasingly accurate.

In a typical SMT manufacturing process, a specialized printer, such as a stencil or screen printer, applies solder paste to "pads" of an unloaded, bare circuit board. "Pads" are conductive locations on one or both sides of a circuit board, to which the leads of SMT components can be soldered. One set of pads is provided for each SMT component, in a geometrical arrangement that matches the arrangement of leads on the component. A typical SMT circuit board includes thousands of pads. A specialized machine, called a "pick-and-place" machine, loads the SMT components onto the circuit board, such that the leads of each component contact the solder paste on the corresponding pads. A "reflow oven" then heats the circuit board, causing the solder paste to reflow. The reflowed solder bonds the SMT components to the circuit board and forms a secure electrical and mechanical connection therebetween.

FIG. 1 illustrates a typical AOI system 100 in conceptual form. A circuit board 110 is placed securely on an inspection table 112. A camera 114 is suspended above the inspection table 112 from a gantry 116, which moves the camera 114 in increments along X and Y-axes. A processor 18 controls the movement of the gantry via a control line 120, and acquires images from the camera via a data line 122. The AOI system 100 inspects the locations of features on the circuit board 110 with respect to an origin 126, which is generally located at a corner of the circuit board.

During operation of the AOI system 100, the gantry 116 moves the camera 114 over the circuit board 110. The camera 114 scans the circuit board and acquires images of the circuit board 110, and the processor 118 performs calculations on the acquired images.

The prior art has used AOI systems like the one shown in FIG. 1 to measure errors in the placement of electronic components. In accordance with the prior art process, the AOI system 100 scans the circuit board 110 to find a particular device, called a device under inspection, or "DUI." The AOI system searches for the DUI through the scanned images, by matching a component shape in the scanned image with a component shape stored in the system's database.

Once the DUI is found, the AOI system using the prior art technique computes a "centroid" for the DUI. The centroid is defined as the location and orientation of the DUI relative to the origin 126 of the circuit board 110. The centroid includes both the X, Y position of the DUI and its angle, "$\Theta$," with respect to the X-axis. Thus, for example, the SMT component 124 on the circuit board 110 might have a centroid of X=5.515", Y=1.005", and $\Theta$=2 degrees, expressed as a coordinate (5.515, 1.005, 2). Next, the AOI system compares the measured centroid of the DUI with an expected centroid stored in the system's database, to determine a centroid error. For example, an expected centroid of (5.520, 1.000, 0) for component 124 would yield a centroid error dX, dY, d$\Theta$ of (−0.005,+0.005,+2). Last, the AOI system separately compares each component of the centroid error with separate specifications for dX, dY, and d$\Theta$. If any component of the centroid error exceeds its specification, the AOI system reports an unsuccessful placement. Otherwise, the system reports a successful placement.

This prior art technique has several disadvantages. First, because centroids are measured with respect to the origin 126 of the circuit board 110, the prior art technique assumes that the circuit board is dimensionally stable. Circuit boards are known to deform, however, in response to temperature, pressure, and chemical reactions. During manufacturing processes, circuit boards are subjected to all of these factors, and their linear dimensions can change by as much as +/−2%. Any changes in the linear dimensions of a circuit board add errors to a component's expected centroid, and therefore add errors to the resulting computations of dX, dY, and d$\Theta$.

That circuit boards deform means that a component could be precisely placed with respect to its expected centroid, and yet be misplaced with respect to its correct position, i.e., with respect to its pads. Under these circumstances, the prior art technique would report a successful placement although the component was not placed on its pads. Conversely, because the prior art technique relies upon an expected centroid that can be erroneous, this technique could also report a misplaced component although the component was perfectly placed on its pads.

Another drawback of the prior art technique is that it does not take into account the interdependency between the placement errors dX, dY, and d$\Theta$. We have recognized that the maximum acceptable angular error of a part d$\Theta$ depends upon the extent of the positional error dX, dY of the part. In addition, the maximum acceptable positional error dX, dY depends upon the extent of the rotational error d$\Theta$. For example, a component placed near the edge of its allowable X, Y range can tolerate little rotational error before some of the component's leads move off of its pads. By comparison, a component that is centered within its X, Y range can tolerate greater rotational error.

The prior art also assumes that all pads on circuit boards align with either the X or Y-axis of a board, and directly applies dX and dY errors as if this were the case. Pads can be oriented at non-quadrant angles, however, and in these cases, the values dX and dY do not represent the correct tolerances for placing a part. For example, we have recognized that components having pads that are rotated by $\Theta$ degrees have actual tolerances $dX^1$ and $dY^1$ that respectively equal the projections of dX and dY, rotated through the angle $\Theta$, on the X and Y-axes. As these projections differ from dX and dY by a factor cosine ($\Theta$), the prior art significantly overestimates tolerances for parts rotated by non-quadrant angles.

SUMMARY OF THE INVENTION

With the foregoing background in mind, it is an object of the invention to accurately verify the locations of components on printed circuit boards.

It is another object of the invention to reduce the number of false errors in component placement diagnosed by automatic inspection systems.

To achieve the foregoing objects and other objectives and advantages, a method of inspecting the placement of a device-under-inspection (DUI) on a circuit board includes acquiring images of the circuit board in a region where the DUI is expected to be found. The method further includes constructing a series of rectangles from the acquired images. A pad-bounding rectangle is constructed that connects a plurality of pads on the circuit board for the DUI, and a pin-bounding rectangle is constructed that connects a plurality of pins of the DUI. The plurality of pins connected by the pin-bounding rectangle corresponds to the plurality of pads connected by the pad-bounding rectangle. Starting from the pad-bounding rectangle, an error-bounding rectangle is constructed that is offset from the pad-bounding rectangle by an allowable error in placing the pins of the DUI on the pads of the circuit board. An unsuccessful placement of the DUI is then reported if any portion of the pin-bounding rectangle lies outside of the error-bounding rectangle.

In accordance with another embodiment of the invention, a method of processing images acquired by an optical inspection system is used to determine whether an object-under-inspection has been properly placed on a circuit board. The method includes constructing a series of rectangles and performing a test on the constructed rectangles. A pad-bounding rectangle is constructed from the acquired images, which connects a plurality of pads on the circuit board for the object-under-inspection. The method then searches for the object-under-inspection in the acquired images. If the object-under-inspection is found, an object-bounding rectangle is constructed that traces one of the inner and outer edges of the object-under-inspection. From the pad-bounding rectangle, an error-bounding rectangle is constructed that is offset from the pad-bounding rectangle by an allowable error in placing the object-under-inspection on the pads of the circuit board. The method further includes reporting a failure in placing the object-under-inspection if any portion of the object-bounding rectangle lies outside of the error-bounding rectangle.

In accordance with another embodiment of the invention, an optical inspection system for measuring the placement of components on a circuit board includes a camera for acquiring images of the circuit board. The optical inspection system further includes a processor, coupled to the camera, for processing the images acquired by the camera. The processor includes pad-bounding software that operates in response to the images acquired by the camera, and constructs a pad-bounding rectangle that connects a plurality of pads on the circuit board for a device under inspection (DUI). The processor also includes pin-bounding software that constructs a rectangle connecting a plurality of pins of the DUI. The plurality of pins correspond to the plurality of pads connected by the pad-bounding rectangle. The processor further includes error-bounding software that constructs an error-bounding rectangle that is offset from the pad-bounding rectangle by an allowable error in placing the pins of the DUI on the pads. Testing software then generates a successful or unsuccessful result depending on whether any portion of the pin-bounding rectangle lies outside of the error-bounding rectangle.

Additional objects, advantages and novel features of the invention will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
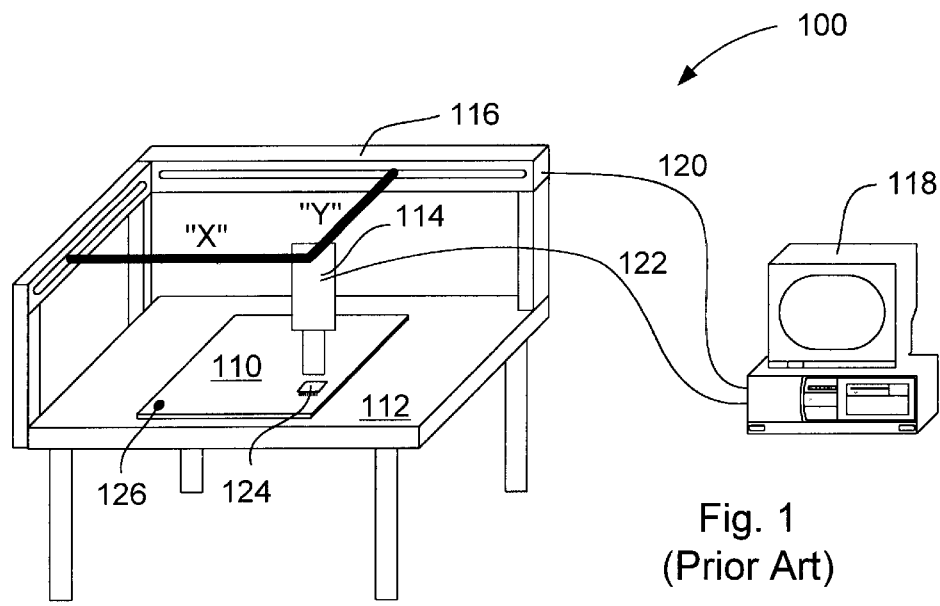
FIG. 1 is an idealized, isometric view of an automatic optical inspection system as used by the prior art.
Figures 2A, 2B, 2C:
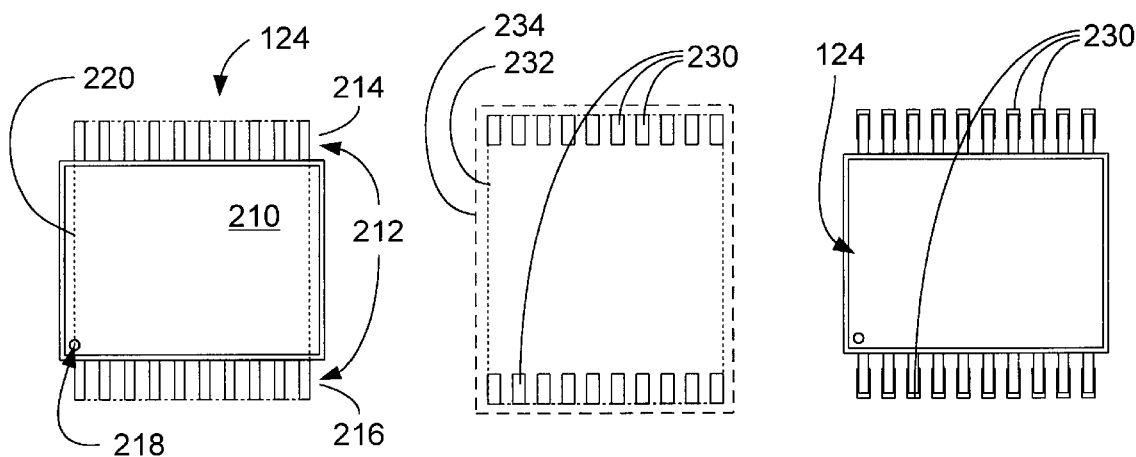
FIG. 2a is a top view of a typical SMT component, showing the body of the component, its leads, and a pin-bounding rectangle drawn around the leads of the component.
FIG. 2b is a top magnified view of a circuit board, showing the pads for the SMT component of FIG. 2a, and showing a pad-bounding rectangle and an error-bounding rectangle constructed around the pads.
FIG. 2c is a top, magnified view of the SMT component of FIG. 2a perfectly placed on the pads of the circuit board shown in FIG. 2b.

FIG. 2a is a magnified view of the SMT component 124 of FIG. 1. The SMT component 124 includes a body 210 and a plurality of leads 212 extending from the body. The SMT component also includes a designator 218 adjacent to pin 1 of the component, which can be used by an AOI system to determine whether the component has been rotated with respect to its correct orientation. Other visible features on the part can be used if no pin 1 designator is provided or visible.

FIG. 2a also illustrates a rectangle 220 drawn around the pins of the SMT component 124. This rectangle, called a "pin-bounding" rectangle, is constructed in accordance with the invention from a scanned image, to aid in accurately locating the SMT component. It is not a physical feature of the part. The role of the pin-bounding rectangle is discussed with reference to FIG. 6, below.

FIG. 2b illustrates a magnified image of the pads for the SMT component 124 on the circuit board 110. Each pad 230 is positioned to match up with a corresponding lead 212 of the SMT component 124. FIG. 2b also illustrates a "pad-bounding" rectangle 232 and an "error-bounding" rectangle 234. Again, these rectangles are not physical features, but are constructed in accordance with the invention. Their roles are also discussed below with reference to FIG. 6.

FIG. 2c illustrates the SMT component 124 positioned on the circuit board 110 directly over the pads 230. It can be seen from FIG. 2c that the SMT component 124 can be slightly shifted or rotated from its illustrated position, without interfering with the connections between the part and the pads.

Figure 3A:
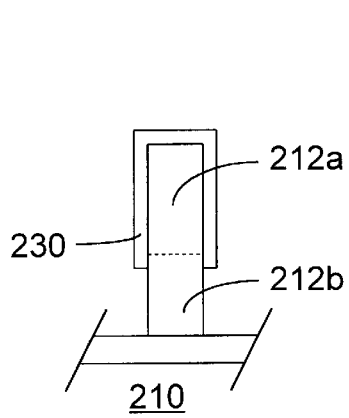
FIG. 3a is a top, magnified view of a single lead of the SMT component of FIG. 2c, placed on its corresponding pad of the circuit board, wherein the lead is perfectly centered on the pad.
Figure 3B:
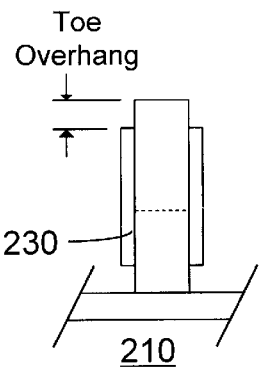
FIG. 3b is similar to FIG. 3a, but shows the lead vertically misplaced on the pad.
Figure 3C:
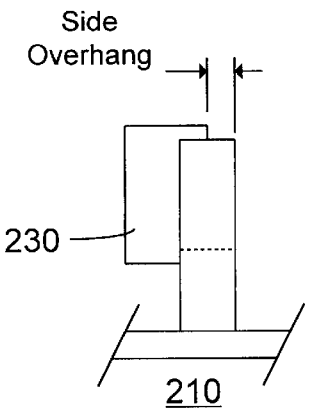
FIG. 3c is similar to FIG. 3c, but shows the lead horizontally misplaced on the pad.

FIGS. 3a–3c illustrate various states of alignment of a lead 212 of the component 124 with respect to a pad 230 to which the lead connects. The lead 212 of FIG. 3a includes a contact region 212a and an extension region 212b. In FIG. 3a, the contact region 212a is perfectly centered with respect to the pad 230. In FIG. 3b, however, the lead 212 is shifted upwards, and the contact region 212a extends beyond the edge of the pad. Similarly, the lead 212 of FIG. 3c is shifted to one side.

The American National Standards Institute (ANSI) had defined standards for the placement of SMT components on circuit board assemblies. These standards specify allowable displacements of component leads relative to their corresponding pads (See ANSI/IPC-A-610). For example, the ANSI standard specifies an acceptable "toe overhang," such as shown in FIG. 3b, of a lead over the end of a pad, as a percentage of the length of the lead's contact region. Similarly, the ANSI standard specifies an acceptable "side overhang," such as shown in FIG. 3c, as a percentage of the lead's width. The present invention specifically focuses on the relative positions of a component's leads with respect to its pads, and thus directly addresses the ANSI specification.

Figure 6:
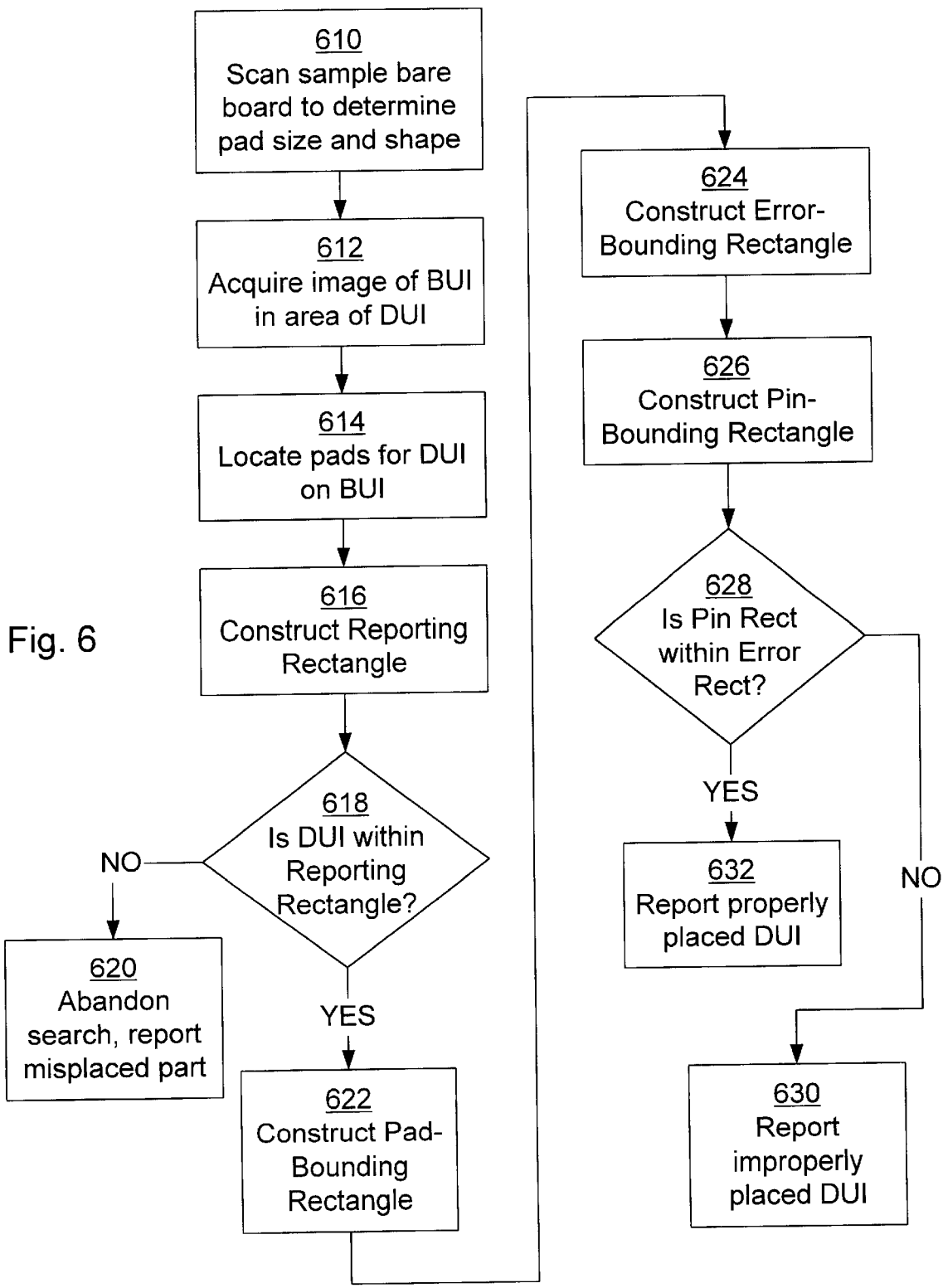
FIG. 6 is a flowchart that illustrates a process for measuring the placement of components according to the invention.

FIG. 6 is a flowchart of a process in accordance with the invention for determining whether components are properly placed on a circuit board. At step 610, an AOI system, for example the AOI system 100 of FIG. 1, scans a sample, unloaded circuit board to determine the circuit board's actual pad sizes and shapes, and stores the scanned images in memory. Alternatively, this step could be omitted, and pad size and shape information could be read directly from a CAD file for the circuit board, such as a Gerber™ artwork file. We have recognized, however, that manufacturers of unloaded circuit boards do not always use the same models for parts that the designers who generate the CAD files use. Therefore, there is a chance that the actual sizes and shapes of pads on a circuit board could differ from the sizes and shapes of the pads stored in the CAD file. It is preferable, therefore, to scan the circuit board to determine actual pad sizes and shapes. Step 610 is preferably performed only one time per circuit board type. Once the AOI system 100 determines the sizes and shapes of the actual pads on the sample circuit board and stores the results, it is not necessary to repeat this step for later-inspected circuit boards of the same type.

At step 612, the AOI system 100 begins inspecting loaded circuit boards, such as the circuit board 110 of FIG. 1. The circuit board being inspected is generally referred to as the "board-under-inspection," or "BUI." This board can be the same circuit board that was scanned at step 610, now loaded with components, or can be a different loaded circuit board of the same type. The AOI system 100 begins its inspection by selecting a component to inspect, the DUI. The AOI system then scans the BUI in an expected region where the DUI should be found, and stores the scanned images in memory. The scanned images may include one or more frames acquired by a camera, such as the camera 114 of Fig. 1.

At step 614, the AOI system processes the stored images of the BUI acquired at step 612, to locate the pads 230 for the selected DUI on the BUI. Although the components loaded on the BUI partially obscure the pads, portions of the pads show through and allow their identification by the AOI system. In locating the pads 230 for the DUI, the AOI system may use any number of other visible features of the BUI, and may refer to the previously stored, scanned images of the sample, unloaded circuit board.

Figure 5:
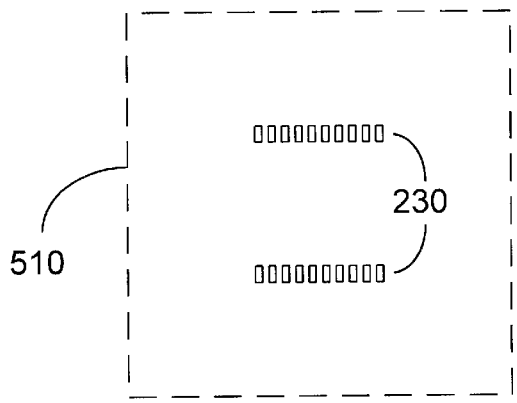
FIG. 5 is a top, magnified view of a circuit board, similar to FIG. 2b, but showing a reporting rectangle placed around the pads for a component.

Once the AOI system locates the pads for the DUI, the AOI system operates on the stored images of the BUI at step 616, to construct an imaginary rectangle concentric with the pads. This rectangle, called the "reporting rectangle," is generally spaced some distance away from the pads 230 for the DUI. FIG. 5 shows an example of a reporting rectangle 510 constructed around the pads 230 for a DUI. The purpose of the reporting rectangle 510 is to define an area on the BUI within which the AOI system will search for the DUI. Compared with the prior art, which searches for a DUI relative to the DUI's expected centroid, the reporting rectangle 510 establishes a search area relative to the DUI's actual pad locations. As linear deformations of the circuit board 110 can offset the expected centroid from the DUI's actual pad locations, the method according to the invention is more accurate than the prior art. The method according to the invention also allows a smaller area of the BUI to be searched, and therefore requires less processing time. Preferably, the dimensions of the reporting rectangle 510 are adjustable by the operator.

Next, the AOI system 100 searches for the DUI within the reporting rectangle. At decision point 618, inspection proceeds if the DUI is found within the reporting rectangle. Otherwise, a gross placement error has occurred, and the AOI system reports the misplaced DUI at step 620 and abandons its search for the DUI. We have recognized that information about misplaced parts can be useful in diagnosing and repairing problems in manufacturing processes. Therefore, step 620 preferably includes, where feasible, feeding back information about the misplaced part to earlier manufacturing steps, for example, feeding information back to a pick-and-place machine.

If the AOI system finds the DUI within the reporting rectangle 510, the AOI system proceeds to determine whether the DUI is properly placed on its pads. At step 622, the AOI system constructs an imaginary pad-bounding rectangle, such as the pad-bounding rectangle 232 of FIG. 2b. The pad-bounding rectangle 232 immediately circumscribes and connects the pads 230 for the DUI. The AOI system may acquire magnified images of the pads to aid in accurately constructing the pad-bounding rectangle 232, as necessary.

At step 624, the AOI system constructs an error-bounding rectangle, such as the error-bounding rectangle 234 of FIG. 2c, around the pad-bounding rectangle 232. As defined by the ANSI specification or by the user, the placement of leads of a DUI on the pads of a BUI is subject to tolerances for toe overhang and side overhang (see FIGS. 3a–3c). These tolerances can be respectively regarded as an allowable lengthwise error and an allowable widthwise error for the placement of a lead over a pad. The AOI system 100 establishes the dimensions of the error-bounding rectangle 234 as the sum of the dimensions of the pad-bounding rectangle 232 and these errors. Specifically, the AOI system establishes the length of the error-bounding rectangle 234 as the length of the pad-bounding rectangle 232 plus the lengthwise error. It establishes the width of the error-bounding rectangle 234 as the width of the pad-bounding rectangle 232 plus the widthwise error. Note that the angle of the pads relative to the X or Y-axes of the circuit board is irrelevant to these computations.

The AOI system preferably determines the lengthwise and widthwise errors based upon actual scanned images of the pins and pads for a DUI. The AOI system examines individual pins of the DUI to determine their precise size and shape. The AOI system also examines individual pads from the stored images of the sample, unloaded board scanned at step 610. By computing the lengthwise and widthwise errors based upon the actual sizes and shapes of individual pins and pads, the invention produces extremely accurate placement tolerances for examining circuit boards.

At step 626, the AOI system constructs an imaginary pin-bounding rectangle, such as the pin-bounding rectangle 220 of FIG. 2a. The pin-bounding rectangle 220 immediately circumscribes and connects the outer edges of the pins of the DUI, based upon the stored images of the DUI found at step 618. The AOI system may acquire magnified images of the pins of the DUI to aid in accurately constructing the pin-bounding rectangle 220, as required.

With the pin-bounding rectangle 220 and the error-bounding rectangle 234 thus established, the AOI system can determine whether the DUI is properly positioned on the BUI. At decision point 628, the AOI system analyzes the constructed pin-bounding and error-bounding rectangles to determine whether any portion of the pin-bounding rectangle 220 extends outside the boundary of the error-bounding rectangle 234. In accordance with the invention, if any portion of the pin-bounding rectangle lies outside the error-bounding rectangle, the DUI is improperly placed, and the AOI system reports an unsuccessful placement at step 630. If no portion of the pin-bounding rectangle 220 lies outside the boundary of the error-bounding rectangle, the AOI system reports a successful placement at step 632.

Figure 4A:
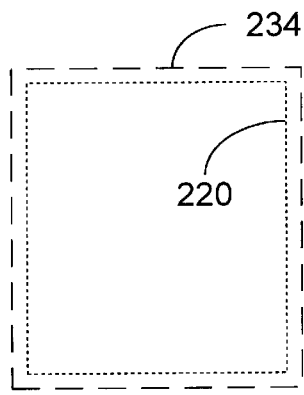
FIG. 4a is a top view of a pin-bounding rectangle and an error-bounding rectangle, and represents a perfectly placed component.
Figure 4B:
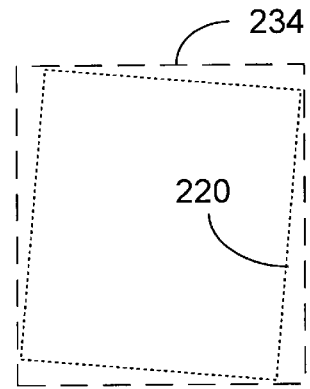
FIG. 4b is similar to FIG. 4a, but represents a component that is rotated with respect to its pads by a significant, although acceptable error.
Figure 4C:
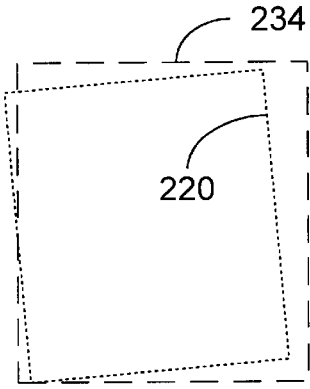
FIG. 4c is similar to FIG. 4b, but represents a component that is rotated by an unacceptable error.

FIGS. 4a–4c provide three different examples of component placements and illustrate the operation of the method described above. FIG. 4a illustrates the pin-bounding rectangle 220 and error-bounding rectangle 234 of a perfectly placed DUI. The size difference between the rectangles has been exaggerated in the figure for clarity. At no point does the pin-bounding rectangle 220 extend outside the boundary of the error-bounding rectangle 234. Therefore, the method according to the invention indicates a successful placement of the DUI for the arrangement of FIG. 4a.

The method according to the invention also indicates a successful placement for the arrangement of FIG. 4b. Although the pin-bounding rectangle 220 is angled with respect to the error-bounding rectangle, indicating an imperfect placement of the DUI, the total placement error is still within the tolerances represented by the error-bounding rectangle 234.

The arrangement of FIG. 4c, however, indicates an unsuccessful placement. As shown in FIG. 4c, the upper-left corner of the pin-bounding rectangle 220 extends outside the allowable error range defined by the error-bounding rectangle 234.

The functions illustrated in FIG. 6 are preferably performed automatically by a processor, such as a computer, which runs software arranged to execute these functions. Different software modules may be provided for each of the separate functions shown in FIG. 6. Providing different modules for each function is not critical, however. Alternatively, the functions identified in FIG. 6 could be combined within one or more software modules or procedures, in whatever manner the software developer sees fit. According to yet another alternative, the functions described in FIG. 6 could be performed with the aid of an operator, or by the operator alone without the aid of a computer.

The method according to the invention accounts for the interrelationship between positional errors and rotational errors in the placement of the DUI. The closer the pin-bounding rectangle 220 is positioned with respect to an edge of the error-bounding rectangle 234, the smaller a rotation can be tolerated before the pin-bounding rectangle crosses the error-bounding rectangle. Similarly, the more the pin-bounding rectangle is rotated with respect to the error-bounding rectangle, the smaller a positional error can be tolerated before the two rectangles cross. As the pin-bounding and error-bounding rectangles respectively represent the true positions of the part and its pads, the method according to the invention correctly handles the interrelationship between positional and rotational errors in placing a DUI.

Using the pin and error-bounding rectangles efficiently handles the interrelationship between positional and rotational errors, although it does so by making an approximation. Mathematically, a rotational error $d\Theta$ slightly reduces the apparent spacing of pins relative to pads, by a factor dependent upon cosine $d\Theta$. This reduction in apparent pad spacing is not significant, however, as small values of $d\Theta$ produce very small reductions, and large values of $d\Theta$ cause the rectangles to cross, thereby flagging an unsuccessful placement.

The use of rectangles to aggregately bound the pins and pads of a part provides an efficient tool for diagnosing the relationships between individual pins and pads. Because lead shape, spacing, and extension is accurately maintained among the many leads of a part, the pin-bounding rectangle efficiently establishes the position of each individual pin of a part by establishing the position of all of the pins. Drawing one rectangle that circumscribes all pins of a part is far more efficient than inspecting each pin individually. Just as the components accurately maintain spacing between their pins, the circuit boards also accurately maintain spacing between their pads. Therefore, providing one pad-bounding rectangle that circumscribes all the pads for a part efficiently establishes the position of each individual pad. This is true although a circuit board may be linearly deformed, as the deformation that applies to the pad-bounding rectangle as a whole applies consistently to the spacing among individual pads.

Having described one embodiment, numerous alternative embodiments or variations might be made. For example, in the embodiment of the invention described above, one pin-bounding rectangle, one pad-bounding rectangle, and one error-bounding rectangle is defined for one component. This is merely an example, however, of one way in which the invention can be practiced. Certain components can be more accurately inspected by providing multiple sets of rectangles. For example, a component having leads that extend from all four sides can be more accurately inspected by providing two separate sets of rectangles, one set for vertically oriented leads, and another for horizontally oriented leads. With two sets of rectangles, each set of leads have their own lengthwise and widthwise errors. With one set of rectangles, however, only one set of lengthwise and widthwise errors are used, causing the lengthwise errors of leads extending along one axis to be applied to the widths of leads extending along a perpendicular axis. Providing two separate sets of rectangles thus increases the accuracy of inspection for these components.

Multiple sets of rectangles can also be used on components having leads with non-uniform size or shape, or on components having leads oriented at non-orthogonal angles. In either case, the leads having a common size, shape, or orientation can be separately grouped. For the AOI system to report a successful placement, all sets of rectangles for a part must pass the test described above. No portion of any pin-bounding rectangle for a set can lie outside of the error-bounding rectangle for that set.

As described above, the pin and pad-bounding rectangles circumscribe the outer edges of the pins and pads for a DUI. Alternatively, the rectangles could be constructed to circumscribe the inner edges of the pins and pads, and the error-bounding rectangle could be constructed by respectively subtracting the lengthwise and widthwise errors from the length and width of the pad-bounding rectangle. A successful placement would then be indicated if no portion of the pin-bounding rectangle crosses inside the error-bounding rectangle.

The preferred embodiment described above concerns inspecting the placement of electronic components on a circuit board. This is merely an example, however, of one application of the invention. The technique described above can be applied generally to inspecting the placement of any "object-under-inspection," including electrical components (SMT or through-hole), solder paste, adhesive, or any other optically recognizable object or material placed on a circuit board during its manufacturing process. Therefore, in accordance with the invention, an "object-bounding" rectangle can be defined that traces the outer edges of the component, solder paste, adhesive, or other object or material, in the same manner that the pin-bounding rectangle was defined above. It should be understood that the term "object-bounding" rectangle includes a rectangle circumscribed around any optically recognizable object and that the "pin-bounding" rectangle 220 is but one example of an object-bounding rectangle. As before, an error-bounding rectangle can be defined around a pad-bounding rectangle. The dimensions of the error-bounding rectangle are based upon lengthwise and widthwise errors specific to the object that is placed. If any portion of the object-bounding rectangle lies outside the error-bounding rectangle, the technique reports a misplaced object. Otherwise, the technique reports a successfully placed object.

FIG. 6 illustrates steps to be performed in accordance with the invention in a particular order. The order presented in FIG. 6 can be varied, however, within the scope of the invention. For example, the pin-bounding rectangle can be constructed either before or after the pad-bounding rectangle. Similarly, the pin-bounding rectangle can be constructed either before or after the error-bounding rectangle.

It should be understood, therefore, that the particular implementation of the invention disclosed herein could be widely varied by those skilled in the art within the scope of the invention. Therefore, the invention should be limited only by the spirit and scope of the appended claims.

What is claimed is:

1. A method of inspecting the placement of a device-under-inspection (DUI) on a circuit board, comprising:
    acquiring images of the circuit board in a region where the DUI is expected to be found;
    constructing, from the acquired images, a pad-bounding rectangle connecting a plurality of pads on the circuit board for the DUI;
    constructing, responsive to the DUI being found, a pin-bounding rectangle connecting a plurality of pins of the DUI, the plurality of pins corresponding to the plurality of pads connected by the pad-bounding rectangle;
    constructing, from the pad-bounding rectangle, an error-bounding rectangle that is offset from the pad-bounding rectangle by an allowable error in placing the pins of the DUI on the pads of the circuit board;
    reporting an unsuccessful placement of the DUI responsive to any portion of the pin-bounding rectangle lying outside of the error-bounding rectangle
    wherein the pad-bounding rectangle has a length and a width,
    the error-bounding rectangle has a length equal to the length of the pad-bounding rectangle plus a lengthwise error in placing a pin of the DUI over a corresponding pad of the DUI, and
    the error-bounding rectangle has a width equal to the width of the pad-bounding rectangle plus a widthwise error in placing the pin of the DUI over the corresponding pad of the DUI.

2. The method of claim 1, wherein the pad-bounding rectangle circumscribes the outermost edges of the plurality of pads, and the pin-bounding rectangle circumscribes the outermost edges of the plurality of pins.

3. The method of claim 2, further comprising:
    constructing a reporting rectangle substantially concentric with the pads for the DUI and extending a distance from the pads; and
    reporting a placement error responsive to the DUI not being found within the reporting rectangle.

4. The method of claim 3, wherein the reporting step further comprises abandoning a search for the DUI on the circuit board responsive to the DUI not being found within the reporting rectangle.

5. The method of claim 3, wherein the reporting step further comprises feeding back information about the misplaced DUI to a pick-and-place machine that placed the DUI.

6. The method of claim 2, wherein at least one of the lengthwise error and the widthwise error is based upon the ANSI standard for Acceptability of Electronic Assemblies.

7. The method of claim 2, wherein at least one of the lengthwise error and the widthwise error is based upon user-definable input.

8. The method of claim 1, further comprising learning pad positions and orientations of an unloaded, bare circuit board to determine actual pad positions and orientations for the DUI.

9. The method of claim 1, wherein the step of constructing the pad-bounding rectangle includes locating the pads for the DUI within the scanned images.

10. The method of claim 1, wherein the step of constructing the pad-bounding rectangle includes accessing a previously stored scanned image of a sample, unloaded circuit board of the same type as the DUI to determine any of the location, orientation, size, and shape of the plurality of pads for the DUI.

11. The method of claim 1, wherein the step of constructing the pad-bounding rectangle includes locating visible features within the at least one image to identify locations of the plurality of pads for the DUI.

12. The method of claim 1, further comprising searching, within the at least one image, for the plurality of pins of the DUI.

13. A method of processing images acquired by an optical inspection system, to determine whether an object-under-inspection has been properly placed on a circuit board, comprising:
    constructing, from the acquired images, a pad-bounding rectangle connecting a plurality of pads on the circuit board for the object-under-inspection;
    searching for the object-under-inspection within the acquired images;

constructing, responsive to the object-under-inspection being found in the acquired images, an object-bounding rectangle tracing one of the inner and outer edges of the object-under-inspection;

constructing, from the pad-bounding rectangle, an error-bounding rectangle that is offset from the pad-bounding rectangle by an allowable error in placing the object-under-inspection on the pads of the circuit board;

reporting a failure in placing the object-under-inspection responsive to any portion of the object-bounding rectangle lying outside of the error-bounding rectangle wherein the pad-bounding rectangle has a length and a width, the error-bounding rectangle has a length equal to the length of the pad-bounding rectangle plus a lengthwise error in placing the object-under-inspection over the plurality of pads for the object-under-inspection, and the error-bounding rectangle has a width equal to the width of the pad-bounding rectangle plus a widthwise error in placing the object-under-inspection over the plurality of pads for the object-under-inspection.

14. The method of claim 13, wherein the pad-bounding rectangle circumscribes the outermost edges of the pads that constitute the plurality of pads in the acquired images, and the object-bounding rectangle circumscribes the outermost edges of the object-under-inspection.

15. An optical inspection system for measuring the placement of components on a circuit board, comprising:

a camera for acquiring images of the circuit board;

a processor, coupled to the camera, for processing the images acquired by the camera, the processor including pad-bounding software, operative in response to the images acquired by the camera, for constructing a pad-bounding rectangle connecting a plurality of pads on the circuit board for a device under inspection (DUI);

pin-bounding software for constructing a rectangle connecting a plurality of pins of the DUI, the plurality of pins corresponding to the plurality of pads connected by the pad-bounding rectangle;

error-bounding software for constructing an error-bounding rectangle that is offset from the pad-bounding rectangle an allowable error in placing the pins of the DUI on the pads; and testing software for generating a successful or unsuccessful result indicative of whether any portion of the pin-bounding rectangle lies outside of the error-bounding rectangle wherein the pad-bounding rectangle has a length and a width, and the error-bounding rectangle has a length equal to the length of the pad-bounding rectangle plus a lengthwise error in placing a pin of the DUI over a corresponding pad of the DUI, and a width equal to the width of the pad-bounding rectangle plus a widthwise error in placing the pin of the DUI over the corresponding pad of the DUI.

16. The system of claim 15, wherein the pad-bounding rectangle circumscribes the outermost edges of the plurality of pads, and the pin-bounding rectangle circumscribes the outermost edges of the plurality of pins.

17. The system of claim 16, further comprising:

reporting software for constructing a reporting rectangle substantially concentric with the pads for the DUI but having a larger area, the reporting software reporting a placement error responsive to the DUI not being found within the reporting rectangle.

* * * * *